(12) United States Patent
Hudgens et al.

(10) Patent No.: US 6,998,289 B2
(45) Date of Patent: Feb. 14, 2006

(54) MULTIPLE LAYER PHASE-CHANGE MEMORY

(75) Inventors: Stephen J. Hudgens, Santa Clara, CA (US); Tyler A. Lowrey, San Jose, CA (US); Patrick J. Klersy, Lake Orion, MI (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 10/302,421

(22) Filed: Nov. 21, 2002

(65) Prior Publication Data

US 2003/0071289 A1    Apr. 17, 2003

Related U.S. Application Data

(62) Division of application No. 09/945,331, filed on Aug. 31, 2001, now Pat. No. 6,507,061.

(51) Int. Cl.
| | |
|---|---|
| H01L 21/00 | (2006.01) |
| H01L 21/06 | (2006.01) |
| H01L 29/04 | (2006.01) |
| H01L 29/18 | (2006.01) |
| H01L 31/036 | (2006.01) |

(52) U.S. Cl. .................. 438/95; 438/102; 257/42; 257/52

(58) Field of Classification Search ................ 257/295, 257/296, 310, 42, 52; 438/95, 102
See application file for complete search history.

(56) References Cited

U.S. PATENT DOCUMENTS

| | | | |
|---|---|---|---|
| 3,801,966 A | | 4/1974 | Terao |
| 4,115,872 A | * | 9/1978 | Bluhm ..................... 365/163 |
| 4,203,123 A | * | 5/1980 | Shanks ..................... 257/2 |
| 4,646,266 A | * | 2/1987 | Ovshinsky et al. ......... 365/105 |
| 5,166,758 A | * | 11/1992 | Ovshinsky et al. ........... 257/3 |
| 5,177,567 A | * | 1/1993 | Klersy et al. ................. 257/4 |
| 5,444,302 A | | 8/1995 | Nakajima et al. |
| 5,789,758 A | * | 8/1998 | Reinberg ..................... 257/3 |
| 5,920,788 A | | 7/1999 | Reinberg |
| 5,952,671 A | | 9/1999 | Reinberg et al. |
| 5,970,372 A | | 10/1999 | Hart et al. |
| 6,117,720 A | | 9/2000 | Harshfield |

(Continued)

FOREIGN PATENT DOCUMENTS

DE    39 27 033 A1    3/1990

(Continued)

OTHER PUBLICATIONS

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS-Compatible Phase-Change Nonvolatile RAM Using NMOS Cell Transistors," presented at 2003 19th IEEE Non-Volatile Semiconductor Memory Workshop, Monterey, California, Feb. 26-20, 2003.

(Continued)

Primary Examiner—Tom Thomas
Assistant Examiner—Jesse A. Fenty
(74) Attorney, Agent, or Firm—Trop, Pruner & Hu, P.C.

(57) ABSTRACT

A phase-change memory may be formed with at least two phase-change material layers separated by a barrier layer. The use of more than one phase-change layer enables a reduction in the programming volume while still providing adequate thermal insulation.

14 Claims, 3 Drawing Sheets

U.S. PATENT DOCUMENTS

| | | | |
|---|---|---|---|
| 6,507,061 B1 * | 1/2003 | Hudgens et al. | 257/295 |
| 6,511,862 B2 * | 1/2003 | Hudgens et al. | 438/95 |
| 6,737,312 B2 * | 5/2004 | Moore | 438/238 |

FOREIGN PATENT DOCUMENTS

| | | |
|---|---|---|
| EP | 0 269 225 A2 | 6/1988 |
| EP | 0 449 121 A2 | 10/1991 |
| EP | 0 957 477 A2 | 11/1999 |
| EP | 1 187 119 A2 | 3/2002 |
| EP | 1 202 285 A2 | 4/2002 |
| EP | 1 202 285 A2 | 5/2002 |
| JP | 60-164937 AA | 8/1985 |
| WO | WO 98/19350 | 10/1997 |
| WO | WO 98/19350 | 5/1998 |

OTHER PUBLICATIONS

Ha, Y.H., Yi, J.H., Horii, H., Park, J.H., Joo, S.H., Park, S.O., Chung, U-In and Moon, J.T., "An Edge Contact Type Cell for Phase Change RAM Featuring Very Low Power Consumption," presented at IEEE 2003 Symposium on VLSI Technology, Kyoto, Japan, Jun. 12-14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S. and Kim, Kinam, "Full Integration and Reliability Evaluation of Phase-change RAM Based on 0.24 mm-CMOS Technologies," presented at IEEE 2003 Symposium on VLSI Technology, Kyoto, Japan, Jun. 12-14, 2003.

Horii, H., Yi, J.H., Park, J.H., Ha, Y.H., Baek, I.G., Park, S.O., Hwang, Y.N., Lee, S.H., Kim, Y.T., Lee, K.H., Chung, U-In and Moon, J.T., "A Novel Cell Technology Using N-doped GeSbTe Films for Phase Change RAM," presented at IEEE 2003 Symposium on VLSI Technology, Kyoto, Japan, Jun. 12-14, 2003.

* cited by examiner

MULTIPLE LAYER PHASE-CHANGE MEMORY

This application is a Divisional of application Ser. No. 09/945,331, filed Aug. 31, 2001, now U.S. Pat. No. 6,507,061.

BACKGROUND

This invention relates generally to memories that use phase-change materials.

Phase-change materials may exhibit at least two different states. The states may be called the amorphous and crystalline states. Transitions between these states may be selectively initiated, for example, through temperature changes. The states may be distinguished because the amorphous state generally exhibits higher resistivity than the crystalline state. The amorphous state involves a more disordered atomic structure and the crystalline state involves a more ordered atomic structure. Generally, any phase-change material may be utilized; however, in some embodiments, thin-film chalcogenide alloy materials may be particularly suitable.

The phase-change may be induced reversibly. Therefore, the memory may change from the amorphous to the crystalline state and may revert back to the amorphous state thereafter, or vice versa. In effect, each memory cell may be thought of as a programmable resistor that reversibly changes between higher and lower resistance states in response to temperature changes. The temperature changes may be induced by resistive heating.

In some situations, the cell may have a large number of states. That is, because each state may be distinguished by its resistance, a number of resistance-determined states may be possible, allowing the storage of multiple bits of data in a single cell.

A variety of phase-change alloys are known. Generally, chalcogenide alloys contain one or more elements from column VI of the periodic table. One particularly suitable group of alloys is GeSbTe alloys.

A phase-change material may be formed within a passage or pore defined through a dielectric material. The phase-change material may be coupled to electrodes on either end of the passage. The contacts may pass current through the passage in order to program the cell through resistive heating or to read the programmed state of the cell.

Current phase-change memories rely on the poor thermal conductivity of the chalcogenide phase-change memory material itself to thermally insulate the programmable volume from heat loss to the upper electrode. Consequently, in order to achieve better thermal isolation and, therefore, more energy efficient programming of the programmable volume, the thickness of the chalcogenide layer has to be increased. An increase of the thickness of the layer, however, also increases the volume of material that is capable of undergoing a phase-change during programming. Increasing the volume of material that undergoes the phase-change can adversely affect reliability, stability, and cycle life of the memory.

Thus, there is a need for a phase-change memory with improved characteristics and performance.

DETAILED DESCRIPTION

Figure 1:
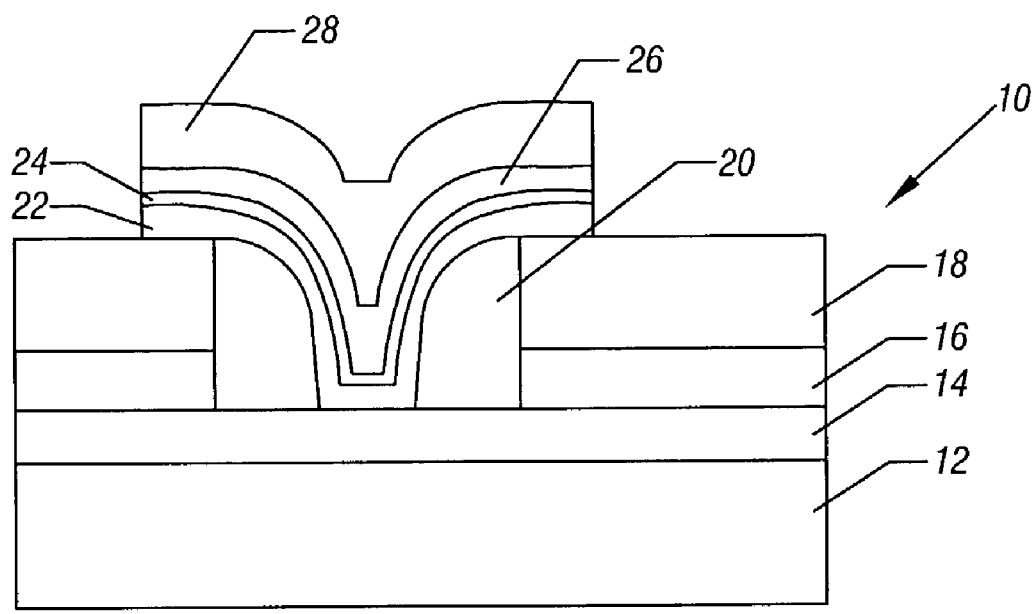
FIG. 1 is an enlarged, cross-sectional view of one embodiment of the present invention.

Referring to FIG. 1, a phase-change memory 10 may be formed on an integrated circuit substrate 12. The phase-change memory 10 may include a lower electrode 14 that in one embodiment may be made of cobalt silicide. An upper electrode 28 sandwiches a lower, programmable phase-change layer 22 and an upper phase-change layer 26. Between the phase-change layers 22 and 26 is a chemical barrier layer 24.

The pore of the phase-change memory 10 may be defined by sidewall spacer 20. That is, the region of contact between the lower electrode 14 and the phase-change layer 22 may be of a size determined through the imposition of the cylindrical sidewall spacer 20. In one embodiment, the pore, including the phase-change layers 22 and 26, may be defined within an opening formed in a pair of insulator layers, such as the upper insulating layer 18 and the lower insulating layer 16. The upper insulating layer 18 may be silicon dioxide in one embodiment, and the lower insulating layer 16 may be silicon nitride in one embodiment.

While a structure is illustrated in which two layers of phase-change material are utilized, more layers may be utilized in other embodiments. The thickness of the first phase-change layer 22 may be in the range of 300 to 500 Angstroms. The thickness of this layer may be chosen so as to reduce the vertical dimension of the programmed volume. The phase-change layer 22 may be deposited in a cup-shaped opening formed by the sidewall spacer 20, resulting in a cup-shaped phase-change layer 22. A similar shape is therefore defined for the barrier layer 24 and the overlying phase-change layer 26. In one embodiment, the phase-change layers 22 and 26 may be formed using vapor deposition.

The barrier layer 24 provides a chemical barrier between the underlying programmable phase-change layer 22 and the overlying phase-change layer 26. The overlying phase-change layer 26 may be provided primarily for thermal isolation in some embodiments. The barrier layer 24 may have adequate electrical conductivity so that the programming current passing through the programmable phase-change layer 22 can flow laterally around any resistive region of the thermal isolation phase-change layer 26 and may contact to the conductive regions of this layer distant from the programming region.

Typical thickness of the barrier layer 24 may be in the range of 50 to 200 Angstroms. The thermally insulating phase-change material layer 26 may also be vapor deposited in situ onto the barrier layer 24. The thermally insulating phase-change material layer 26 can be made of the same composition as the programmable phase-change layer 22 or it can be chosen from a range of available chalcogenide materials with poor thermal conductivity. In one embodiment, it is advantageous that the layer 26 has a thermal conductivity of less than 1E-2 W/cm.K and good electrical conductivity, for example, greater than 40 $\Omega^{-1}$ cm$^{-1}$. The thickness of the layer 26 can be in the range of from 100 to more than 1,000 Angstroms.

Figure 2:
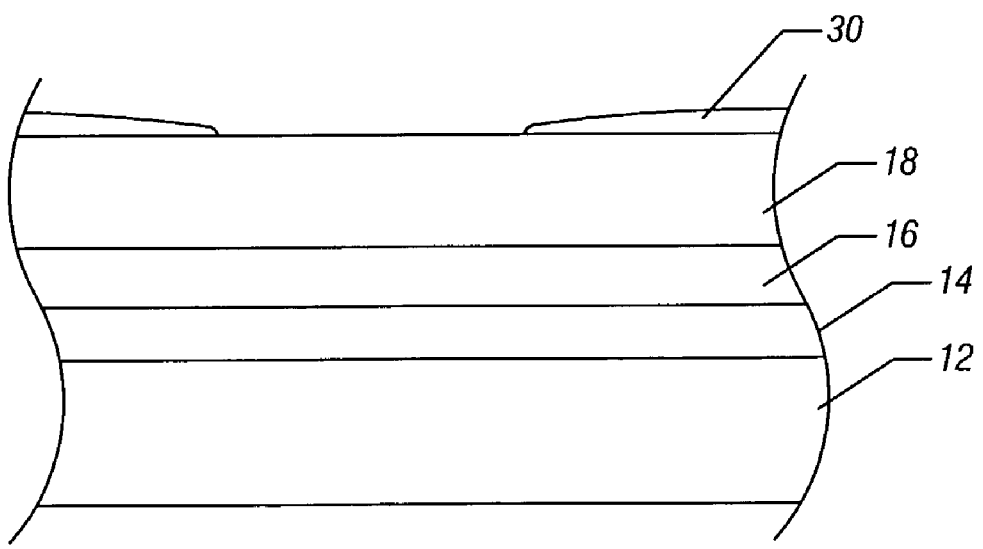
FIG. 2 is an enlarged, cross-sectional view of an initial stage of manufacturing of the device shown in FIG. 1 in accordance with one embodiment of the present invention.

Referring to FIG. 2, a mask 30 may be defined on a stack including the substrate 12 covered by the lower electrode 14, the first insulating layer 16, the second insulating layer 18.

Figure 3:
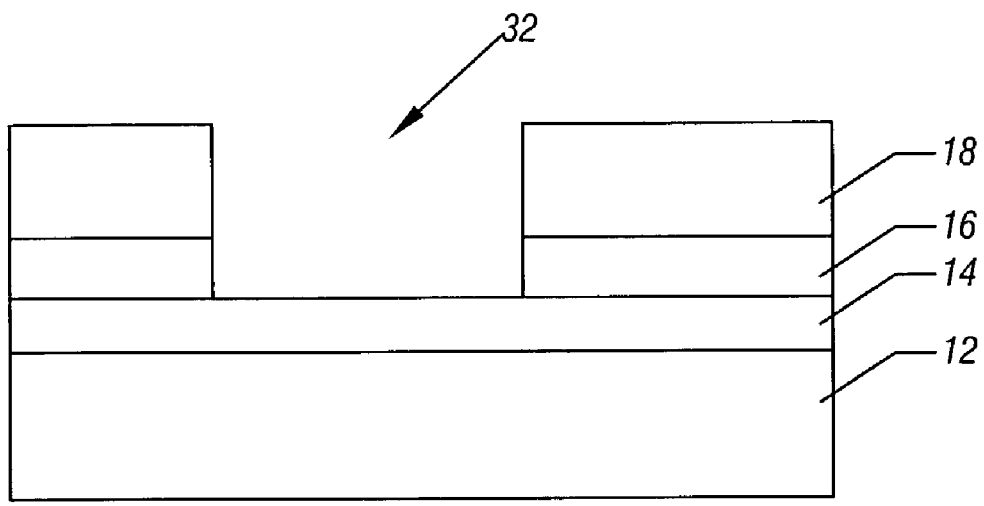
FIG. 3 is an enlarged, cross-sectional view of the embodiment shown in FIG. 2 at a later stage of manufacturing in accordance with one embodiment of the present invention.
Figure 4:
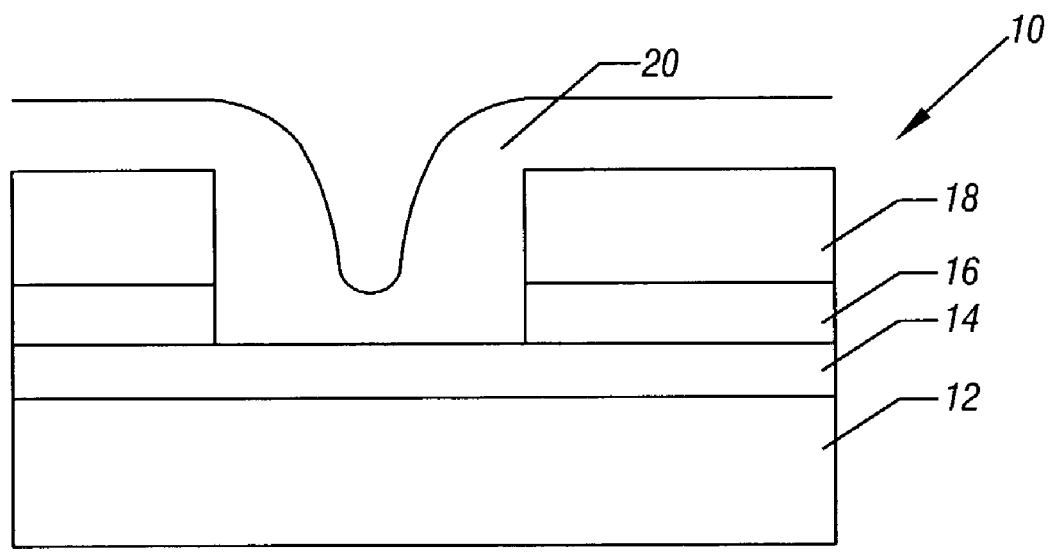
FIG. 4 is an enlarged, cross-sectional view of the embodiment shown in FIG. 3 at still a later stage of manufacturing in accordance with one embodiment of the present invention.
Figure 5:
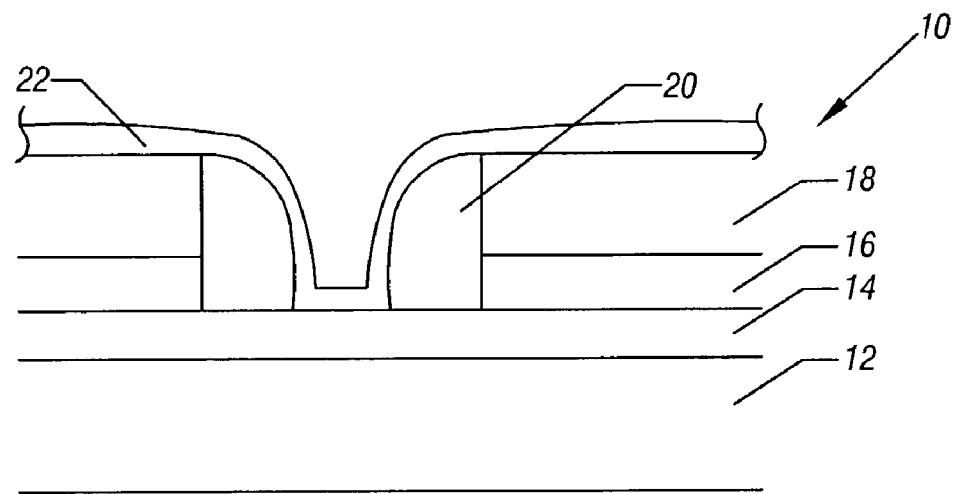
FIG. 5 is an enlarged, cross-sectional view corresponding to FIG. 4 at still a later stage of manufacturing in accordance with one embodiment of the present invention.

Turning next to FIG. 3, an opening 32 may be etched through the insulating layers 16 and 18, stopping on the lower electrode 14. In one embodiment, an etchant that is selective to the layers 16 and 18 and that is less effective against the electrode 14 may be utilized. Thereafter, the insulating material 20 may be deposited into the pore and over the layer 18, as shown in FIG. 4. A variety of insulating layers may be utilized including oxide. In one embodiment, a tetraethylorthosilicate (TEOS) oxide deposition process may be utilized. The deposited layer 20 is then subjected to an anisotropic etch to form the cylindrical sidewall spacer 20 as shown in FIG. 5.

Figure 6:
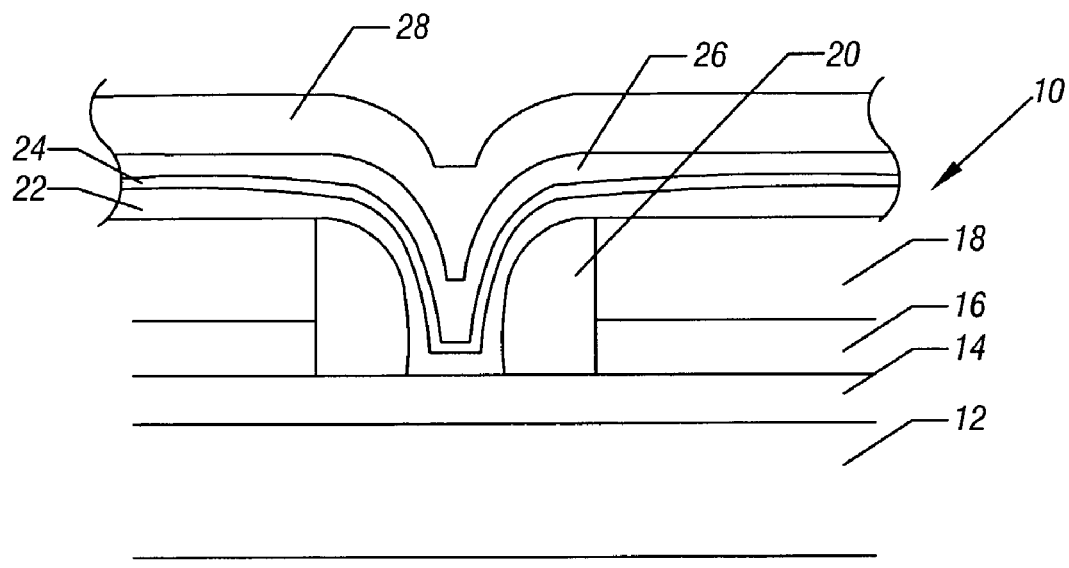
FIG. 6 is an enlarged, cross-sectional view of the embodiment shown in FIG. 5 at a later stage of manufacturing in accordance with one embodiment of the present invention.

The sidewall spacer 20 and insulating layer 18 may then be coated with the programmable phase-change layer 22. The layer 22 may then be coated with the barrier layer 24 and the insulating phase-change layer 26. Finally, the upper electrode 28 may be deposited. Because of the imposition of the sidewall spacer 20, each of the layers 22, 24, 26 and 28, to some degree, may be defined in a cup-shaped configuration. The structure shown in FIG. 6 may then be subjected to patterning and etching to result in the structure shown in FIG. 1 in some embodiments.

Through the use of multiple chalcogenide layers, the memory cell 10 benefits from the enhanced thermal isolation. At the same time, the volume of material that undergoes a phase-change during programming may be relatively limited. In other words, the insulating effect of the combined layers 22 and 26 may reduce heat loss from the memory 10, improving programming performance. At the same time, it is not necessary to program the insulating layer 26, reducing the volume of material that must undergo the phase-change during programming. This may improve reliability, stability, and cycle life of the memory 10 in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a pore over a substrate;
   forming a sidewall spacer on said pore;
   forming a first layer of a phase-change material over said sidewall spacer;
   forming a non-phase-change material over said first layer; and
   forming a second layer of a phase-change material over said non-phase-change material.

2. The method of claim 1 including forming the first and second layers of the same material.

3. The method of claim 1 including forming the first and second layers of different materials.

4. The method of claim 1 including forming a conductive non-phase-change material.

5. The method of claim 1 including forming a contact over said substrate and forming said sidewall spacer on said contact.

6. The method of claim 5 including contacting said contact with said first layer.

7. The method of claim 1 including forming said first layer to have a thickness between about 300 to 500 Anstroms.

8. The method of claim 7 including forming said non-phase change material to have a thickness of 50 to 200 Angstroms.

9. A method comprising:
   forming a pore over a substrate;
   forming a sidewall spacer in said pore;
   forming a first layer of a phase change material having a first thickness;
   forming a non-phase change material over said first layer, said non-phase change material having a second thickness less than said first thickness;
   forming a second layer of a phase change material over said non-phase change material such that said first and second layers are completely separated by said non-phase change material; and
   forming said first and second layers in said non-phase change material over said sidewall spacer.

10. The method of claim 9 including forming the first and second layers of the same material.

11. The method of claim 9 including forming the first and second layers of different materials.

12. The method of claim 9 including forming a conductive non-phase-change material.

13. The method of claim 9 including forming a contact over said substrate and forming a sidewall spacer on said contact.

14. The method of claim 13 including contacting said contact with said first layer.

* * * * *